United States Patent
Houston et al.

(10) Patent No.: US 10,748,913 B2
(45) Date of Patent: *Aug. 18, 2020

(54) SRAM CELL WITH T-SHAPED CONTACT

(71) Applicant: TEXAS INSTRUMENTS INCORPORATED, Dallas, TX (US)

(72) Inventors: Theodore W. Houston, Richardson, TX (US); Thomas J. Aton, Dallas, TX (US); Scott W. Jessen, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/225,124

(22) Filed: Dec. 19, 2018

(65) Prior Publication Data
US 2019/0148386 A1 May 16, 2019

Related U.S. Application Data

(60) Continuation of application No. 13/043,163, filed on Mar. 8, 2011, now Pat. No. 10,199,380, which is a division of application No. 12/479,266, filed on Jun. 5, 2009, now Pat. No. 10,163,911.

(51) Int. Cl.
*H01L 27/11* (2006.01)
*H01L 27/02* (2006.01)
*H01L 21/8234* (2006.01)

(52) U.S. Cl.
CPC .. *H01L 27/1104* (2013.01); *H01L 21/823475* (2013.01); *H01L 27/0207* (2013.01); *H01L 27/11* (2013.01); *Y10S 257/903* (2013.01)

(58) Field of Classification Search
CPC .. H01L 27/1104; H01L 27/11; H01L 27/0207; H01L 21/823475; Y10S 257/903
USPC ........ 438/152, 154, 525, 666; 257/288, 393, 257/E21.427, E21.661, E27.099
See application file for complete search history.

(56) References Cited

U.S. PATENT DOCUMENTS

| | | |
|---|---|---|
| 2003/0067819 A1 | 4/2003 | Satomi et al. |
| 2007/0080423 A1 | 4/2007 | Tsuboi et al. |
| 2007/0099424 A1 | 5/2007 | Rathsack et al. |
| 2008/0048297 A1 | 2/2008 | Yang et al. |

*Primary Examiner* — David Chen
(74) *Attorney, Agent, or Firm* — Rose Alyssa Keagy; Charles A. Brill; Frank D. Cimino (57) ABSTRACT

An integrated circuit containing an array of SRAM cells with T-shaped contacts in the inverters, in which drain connecting segments may extend beyond gate connecting segments by a distance greater than 10 percent of a separation distance between ends of opposite drain connecting segments. The drain connecting segments may also extend beyond gate connecting segments by a distance greater than one-third of the width of the gate connecting segments. A process of forming an integrated circuit containing an array of SRAM cells with T-shaped contacts in which drain connecting segments may extend beyond gate connecting segments by a distance greater than 10 percent of a separation distance between ends of opposite drain connecting segments. A process may also form the drain connecting segments to extend beyond gate connecting segments by greater than one-third of the width of the gate connecting segments.

24 Claims, 7 Drawing Sheets

SRAM CELL WITH T-SHAPED CONTACT

CROSS-REFERENCE TO RELATED APPLICATIONS

This application is a continuation of and claims the benefit of U.S. patent application Ser. No. 13/043,163 filed on Mar. 8, 2011, currently pending, which is a divisional of and claims the benefit of application Ser. No. 12/479,266, filed Jun. 5, 2009, the content of all of which are hereby incorporated by reference.

FIELD OF THE INVENTION

This invention relates to the field of integrated circuits. More particularly, this invention relates to SRAMs in integrated circuits.

DETAILED DESCRIPTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this disclosure, the term "static random access memory," referred to hereafter as SRAM, is understood to mean any memory in which data is stored in cells as voltage levels on cross-coupled inverters. SRAM cells are understood to include six-transistor cells, cells with separate read ports and write ports, cells with ferroelectric capacitors, and any other memory cells with cross-coupled inverters.

In this disclosure, the term "driver transistor" is understood to refer to a metal oxide semiconductor (MOS) transistor, possibly a field effect transistor, a finFET transistor or a carbon nanotube transistor (CNT), in an SRAM cell. A drain node of the driver transistor is connected to a data node of the SRAM cell. A gate node of the driver transistor is connected to an opposite data node of the SRAM cell from the driver drain node. A source node of the driver transistor is connected to a power supply node, typically either Vdd for PMOS driver transistors or Vss for NMOS driver transistors.

Similarly, the term "load transistor" is understood to refer to another MOS transistor, possibly a field effect transistor, a finFET transistor or a CNT, in the SRAM cell. A drain node of the load transistor is connected to a data node of the SRAM cell. A gate node of the load transistor is connected to an opposite data node of the SRAM cell from the load drain node. A source node of the load transistor is connected to a power supply node, typically either Vdd for PMOS load transistors or Vss for NMOS load transistors. A polarity of the load transistor is opposite a polarity of driver transistors.

The term "passgate transistor" is understood to refer to yet another MOS transistor, possibly a field effect transistor, a finFET transistor or a CNT, in the SRAM cell, of which one source/drain node is connected to a data node of the SRAM cell and an opposite source/drain node is connected to a corresponding data line of the SRAM cell. Similarly, the term "access transistor" is understood to refer to a MOS transistor in the SRAM cell, of which one source/drain node is connected to a data node of the SRAM cell and an opposite source/drain node is connected to a read buffer transistor. For the purposes of this disclosure, use of the term passgate transistor will be distinguished from use of the term access transistor by a convention in which passgate transistors are never connected to read buffer transistors while access transistors are always connected to read buffer transistors.

In some instances of integrated circuits containing SRAM cell arrays, substantially all circuits in the integrated circuit are dedicated to operation of the SRAM array. In these instances, circuits which provide data to be stored in the SRAM array and circuits which use data from the SRAM array are located outside the integrated circuit containing the SRAM array. In other instances of integrated circuits containing SRAM cell arrays, such as microprocessors, digital signal processors and wireless telephony controllers, the circuits which provide data to be stored in the SRAM array and the circuits which use data from the SRAM array are located within the integrated circuit.

An SRAM cell in an integrated circuit may contain T-shaped contacts, in which each T-shaped contact provides an electrical connection between a drain node of a driver transistor and a drain node of a corresponding load transistor in one inverter and a gate of an opposite inverter, where the two inverters form cross-coupled inverters in the SRAM cell. A photolithographic exposure step for drain connecting segments of the T-shaped contacts connecting the drain nodes of the driver transistors and the load transistors may be performed separately from a photolithographic exposure step for the gate connecting segments of the T-shaped contacts connecting the inverter gates to the drain connecting segments. In one embodiment, an inner corner of the intersection of each gate connecting segment with its corresponding drain connecting segment may be laterally offset from a nearest end of the drain connecting segment by an amount greater than 10 percent of a separation between opposite drain connecting segments within the SRAM cell, so as to increase a separation of the gate connecting segments. In another embodiment, the inner corner of the intersection of each gate connecting segment with its corresponding drain connecting segment may be laterally offset from the nearest end of the drain connecting segment by an amount greater than one-third of a width of the gate connecting segment. In one embodiment, each gate connecting segment may be substantially perpendicular to its corresponding drain connecting segment. In another embodiment, each gate connecting segment may be tilted with respect to its corresponding drain connecting segment. In a further embodiment, each gate connecting segment may have some curvature.

Figure 1A:
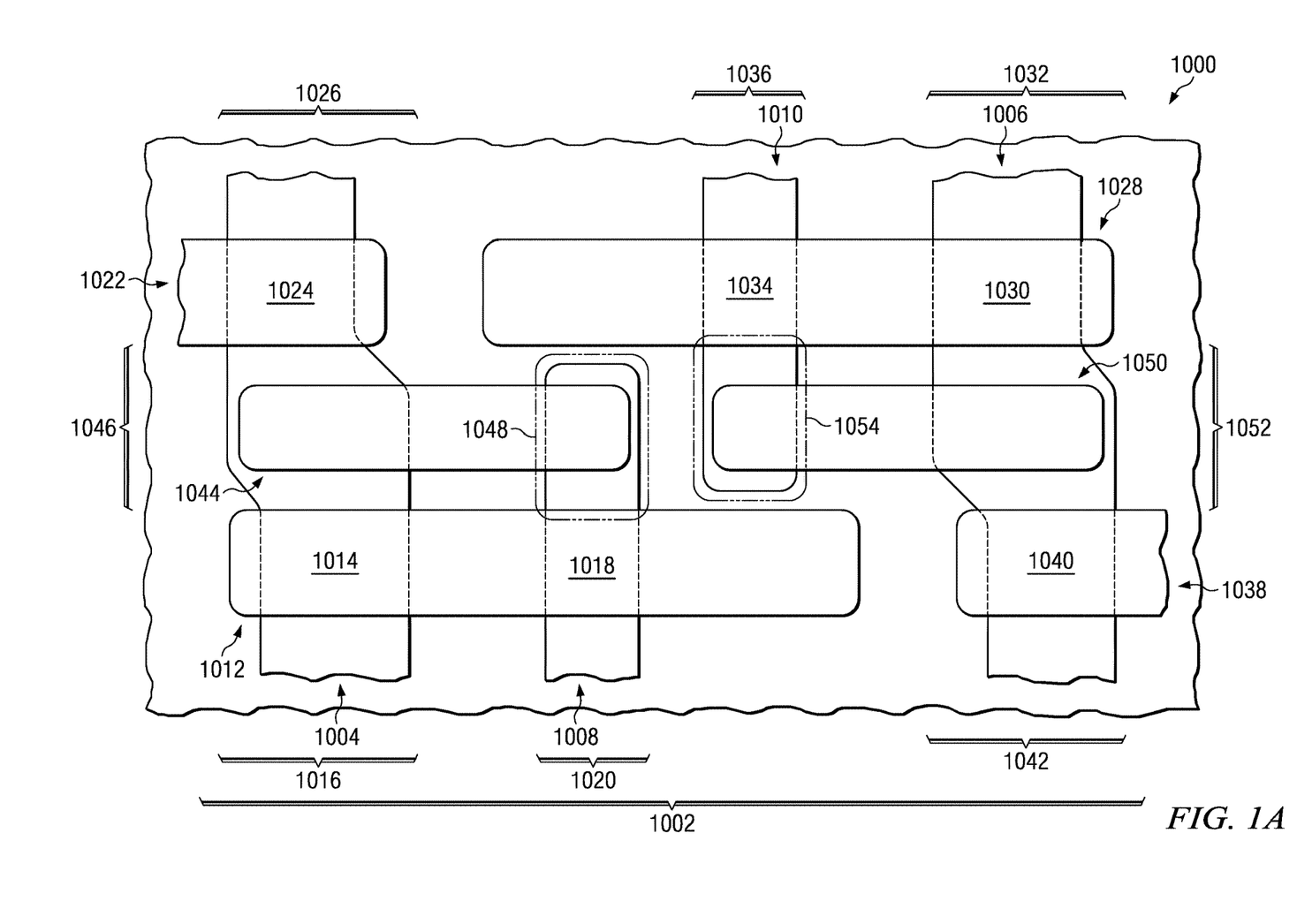
FIG. 1A through 1C are top views of a pair of cross-coupled inverters in an SRAM cell contained in an integrated circuit, in which T-shaped contacts are formed according to a first embodiment.
Figure 1B:
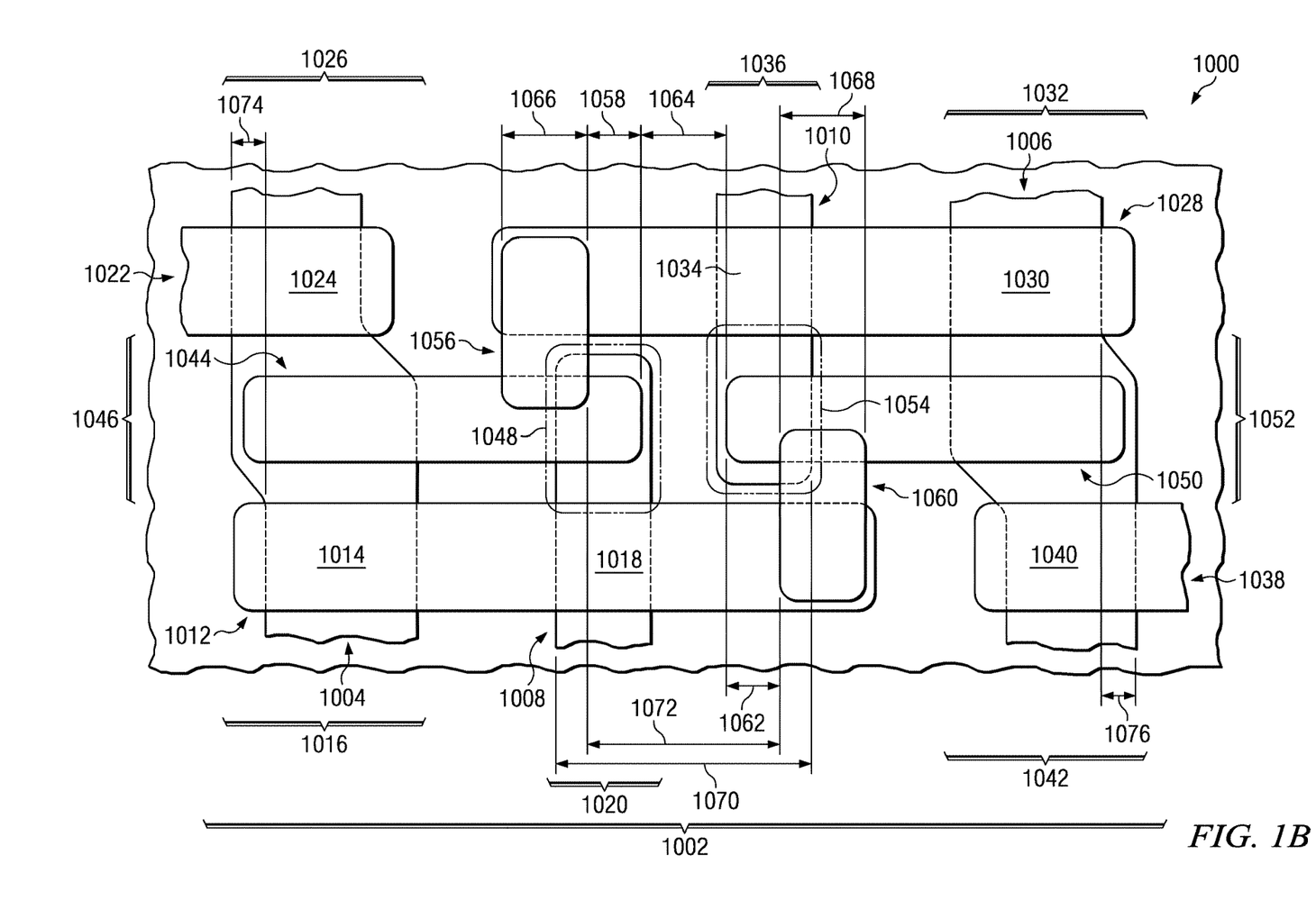
Figure 1C:
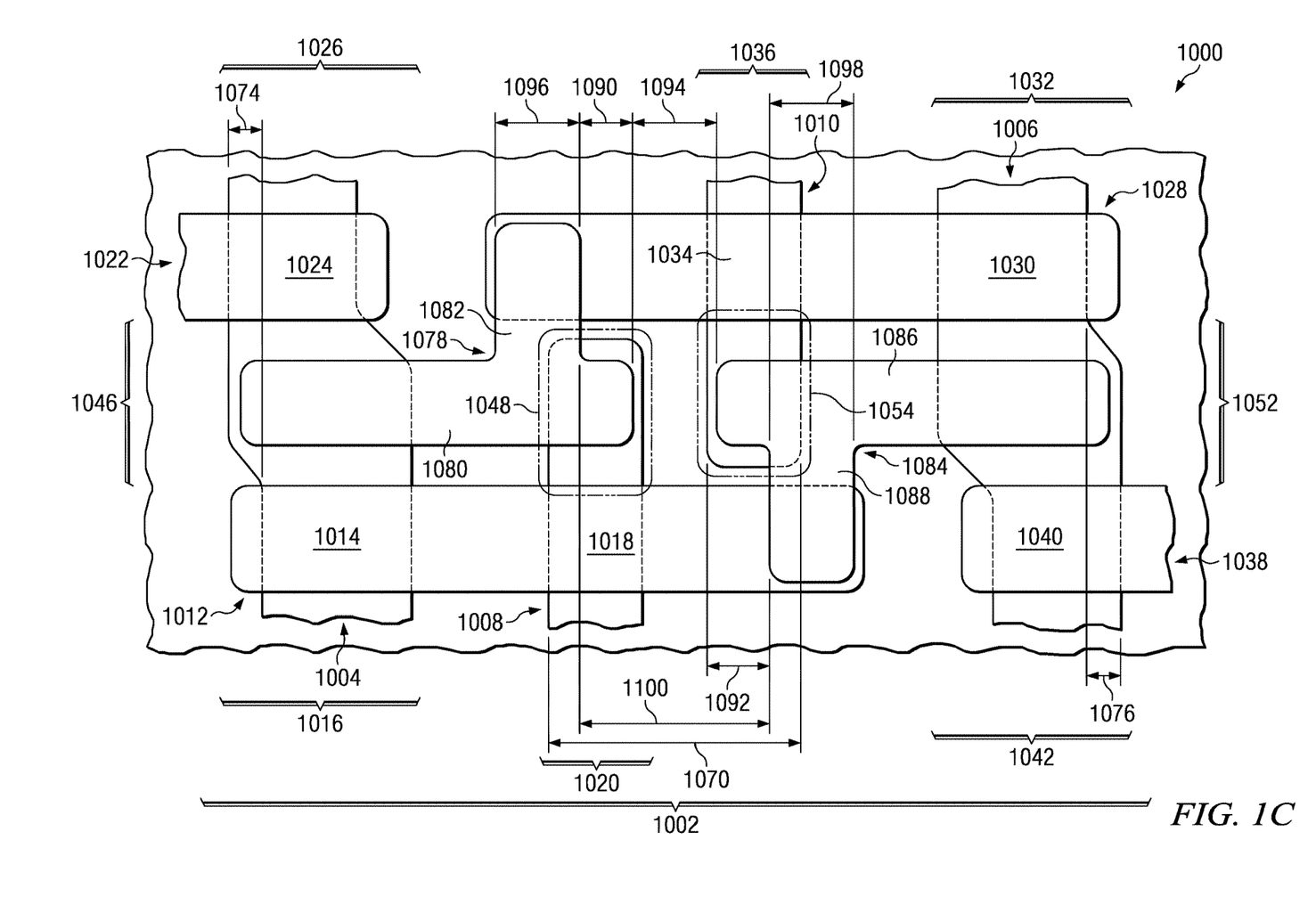

FIG. 1A through 1C are top views of a pair of cross-coupled inverters in an SRAM cell (1002) contained in an integrated circuit (1000), in which T-shaped contacts are formed according to a first embodiment and depicted in successive stages of fabrication. Referring to FIG. 1A, the SRAM cell (1002) includes a first driver/passgate active strip (1004) and a second driver/passgate active strip (1006). In some embodiments, the driver/passgate active strips (1004, 1006) may be n-type. In other embodiments, the driver/passgate active strips (1004, 1006) may be p-type. The SRAM cell (1002) includes a first load active strip (1008) and a second load active strip (1010). The load active strips (1008, 1010) are an opposite conductivity type from the driver/passgate active strips (1004, 1006).

The SRAM cell (1002) includes a first inverter gate (1012) which crosses the first driver/passgate active strip (1004) and the first load active strip (1008). An area of the first driver/passgate active strip (1004) overlapped by the first inverter gate (1012) forms a channel region (1014) of a first driver transistor (1016) of the SRAM cell (1002). An area of the first load active strip (1008) overlapped by the first inverter gate (1012) forms a channel region (1018) of a first load transistor (1020) of the SRAM cell (1002). The SRAM cell (1002) also includes a first passgate gate (1022) which crosses the first driver/passgate active strip (1004). An area of the first driver/passgate active strip (1004) overlapped by the first passgate gate (1022) forms a channel region (1024) of a first passgate transistor (1026) of the SRAM cell (1002). The first driver transistor (1016) and first load transistor (1020) are part of a first inverter of the SRAM cell (1002).

Similarly, the SRAM cell (1002) includes a second inverter gate (1028) which crosses the second driver/passgate active strip (1006) and the second load active strip (1010). An area of the second driver/passgate active strip (1006) overlapped by the second inverter gate (1028) forms a channel region (1030) of a second driver transistor (1032) of the SRAM cell (1002). An area of the second load active strip (1010) overlapped by the second inverter gate (1028) forms a channel region (1034) of a second load transistor (1036) of the SRAM cell (1002). The SRAM cell (1002) includes a second passgate gate (1038) which crosses the second driver/passgate active strip (1006). An area of the second driver/passgate active strip (1006) overlapped by the second passgate gate (1038) forms a channel region (1040) of a second passgate transistor (1042) of the SRAM cell (1002). The second driver transistor (1032) and second load transistor (1036) are part of a second inverter of the SRAM cell (1002).

During a manufacturing process, a dielectric layer (not shown) is formed on the top surface of the integrated circuit (1000) described supra. Then a layer of photoresist (not shown) is formed over the dielectric layer. A first drain connecting segment patterned area (1044) of a first T-shaped contact of the SRAM cell (1002) is formed by a first photolithographic exposure step so that the first drain connecting segment patterned area (1044) overlaps the first driver/passgate active strip (1004) over a drain node (1046) of the first driver transistor (1016), and also overlaps the first load active strip (1008) over a drain node (1048) of the first load transistor (1020). A second drain connecting segment patterned area (1050) of a second T-shaped contact of the SRAM cell (1002) is also formed by the first photolithographic exposure step so that the second drain connecting segment patterned area (1050) overlaps the second driver/passgate active strip (1006) over a drain node (1052) of the second driver transistor (1032), and also overlaps the second load active strip (1010) over a drain node (1054) of the second load transistor (1036).

In another step of the manufacturing process, shown in FIG. 1B, a first gate connecting segment patterned area (1056) of the first T-shaped contact is formed by a second photolithographic exposure step so that the first gate connecting segment patterned area (1056) overlaps the second inverter gate (1028) and intersects the first drain connecting segment patterned area (1044) so that an end of the first drain connecting segment patterned area (1044) over the drain node (1048) of the first load transistor (1020) extends beyond the first gate connecting segment patterned area (1056) by a first pattern lateral offset distance (1058). In the instant embodiment, the intersecting edges of the first drain connecting segment patterned area (1044) and the first gate connecting segment patterned area (1056) are substantially perpendicular.

Similarly, a second gate connecting segment patterned area (1060) of the second T-shaped contact is formed by the same second photolithographic exposure step so that the second gate connecting segment patterned area (1060) overlaps the first inverter gate (1012) and intersects the second drain connecting segment patterned area (1050) so that an end of the second drain connecting segment patterned area (1050) over the drain node (1054) of the second load transistor (1036) extends beyond the second gate connecting segment patterned area (1060) by a second pattern lateral offset distance (1062). In the instant embodiment, intersecting edges of the second drain connecting segment patterned area (1050) and the second gate connecting segment patterned area (1060) are substantially perpendicular.

In one realization of the instant embodiment, the first pattern lateral offset distance (1058) and the second pattern lateral offset distance (1062) may each be greater than 10 percent of an end separation distance (1064) between ends of the first drain connecting segment patterned area (1044) and the second drain connecting segment patterned area (1050). In an alternate realization, the first pattern lateral offset distance (1058) may be greater than one-third of a width (1066) of the first gate connecting segment patterned area (1056), and the second pattern lateral offset distance (1062) may be greater than one-third of a width (1068) of the second gate connecting segment patterned area (1060).

The outer edges of the first load active strip (1008) and the second load active strip (1010) are separated by a load active strip outer distance (1070). Inner edges of the first gate connecting segment patterned area (1056) and the second gate connecting segment patterned area (1060) are separated by a gate connecting segment patterned area inner distance (1072).

In another realization of the instant embodiment, an outer edge of the channel region (1024) of the first passgate transistor (1026) may extend beyond an outer edge of the channel region (1014) of the first driver transistor (1016) by a first driver/passgate active offset distance (1074) which may be greater than half of the first pattern lateral offset distance (1058). Similarly, an outer edge of the channel region (1040) of the second passgate transistor (1042) may extend beyond an outer edge of the channel region (1030) of the second driver transistor (1032) by a second driver/passgate active offset distance (1076) which may be greater than half of the second pattern lateral offset distance (1062).

In yet another step of the manufacturing process, shown in FIG. 1C, the first T-shaped contact (1078) is formed in an area defined by the first drain connecting segment patterned area (1044) and the first gate connecting segment patterned area (1056) depicted in FIG. 1B. The first T-shaped contact (1078) includes a first drain connecting segment (1080) in the area defined by the first drain connecting segment patterned area (1044) of FIG. 1B and a first gate connecting segment (1082) in the area defined by the first gate connecting segment patterned area (1056) of FIG. 1B. The first drain connecting segment (1080) makes electrical contact to the drain node (1046) of the first driver transistor (1016) and to the drain node (1048) of the first load transistor (1020). The first gate connecting segment (1082) makes electrical contact to the second inverter gate (1028). Thus, the first T-shaped contact (1078) provides an electrical connection between the drain node (1046) of the first driver transistor (1016), the drain node (1048) of the first load transistor (1020), and the second inverter gate (1028).

The second T-shaped contact (1084) is formed in an area defined by the second drain connecting segment patterned area (1050) and the second gate connecting segment patterned area (1060). The second T-shaped contact (1084) is formed concurrently with the first T-shaped contact (1078). The second T-shaped contact (1084) includes a second drain connecting segment (1086) in the area defined by the second drain connecting segment patterned area (1050) of FIG. 1B and a second gate connecting segment (1088) in the area defined by the second gate connecting segment patterned area (1060) of FIG. 1B. The second drain connecting segment (1086) makes electrical contact to the drain node (1052) of the second driver transistor (1032) and to the drain node (1054) of the second load transistor (1036). The second gate connecting segment (1088) makes electrical contact to the first inverter gate (1012). Thus, the second T-shaped contact (1084) provides an electrical connection between the drain node (1052) of the second driver transistor (1032), the drain node (1054) of the second load transistor (1036), and the first inverter gate (1012).

An end of the first drain connecting segment (1080) over the drain node (1048) of the first load transistor (1020) extends beyond the first gate connecting segment (1082) by a first contact lateral offset distance (1090). An end of the second drain connecting segment (1086) over the drain node (1054) of the second load transistor (1036) extends beyond the second gate connecting segment (1088) by a second contact lateral offset distance (1092). In one realization of the instant embodiment, the first contact lateral offset distance (1090) and the second contact lateral offset distance (1092) may each be greater than 10 percent of an end separation distance (1094) between ends of the first drain connecting segment (1080) and the second drain connecting segment (1086). In an alternate realization, the first contact lateral offset distance (1090) may be greater than one-third of a width (1096) of the first gate connecting segment (1082), and the second contact lateral offset distance (1092) may be greater than one-third of a width (1098) of the second gate connecting segment (1088).

The inner edges of the first gate connecting segment (1082) and second gate connecting segment (1088) are separated by a gate connecting segment inner distance (1100). In one realization of the instant embodiment, the first driver/passgate active offset distance (1074) may be greater than half of the first contact lateral offset distance (1090), and the second driver/passgate active offset distance (1076) may be greater than half of the second contact lateral offset distance (1092).

Figure 2A:
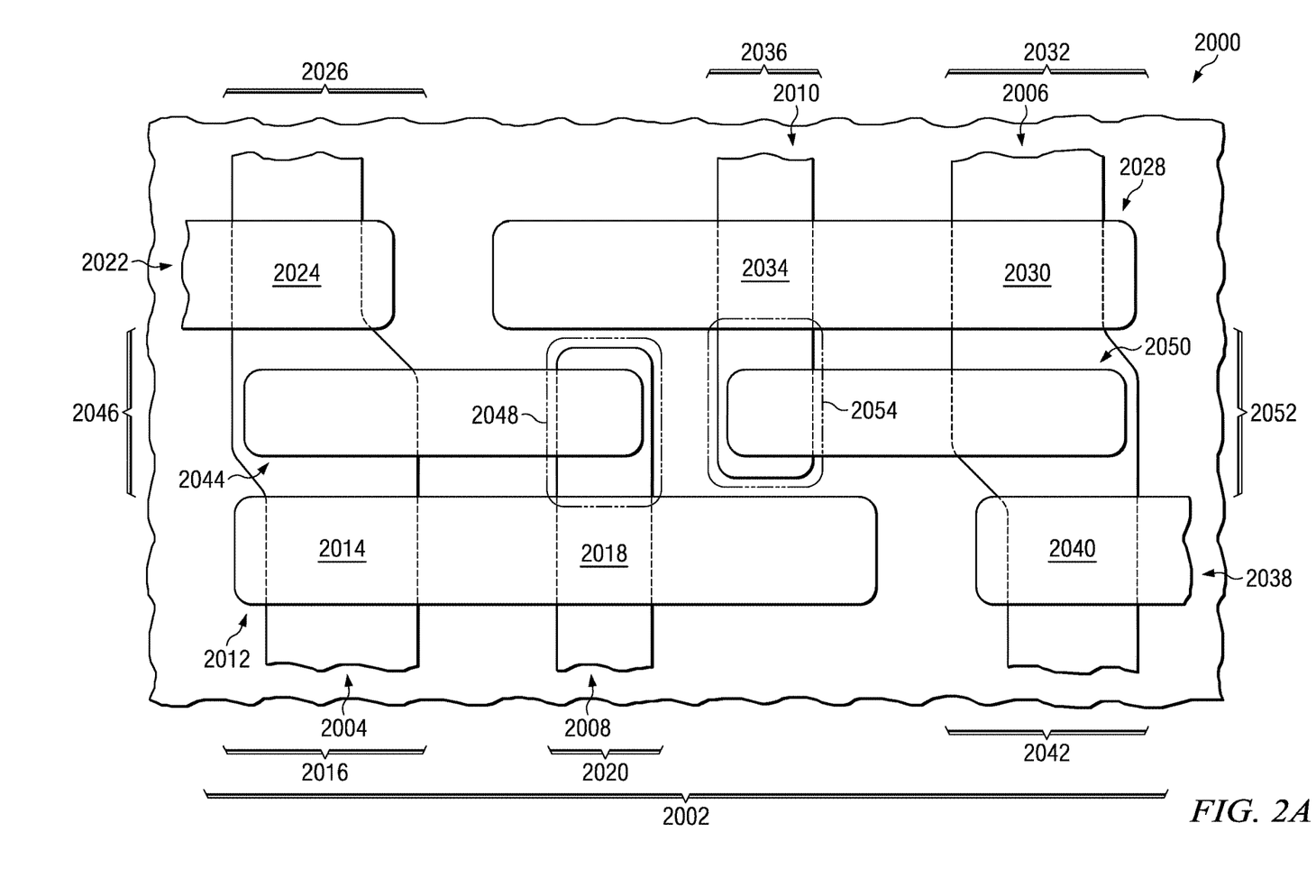
FIG. 2A through 2C are top views of a pair of cross-coupled inverters in an SRAM cell contained in an integrated circuit, in which T-shaped contacts are formed according to a second embodiment and depicted in successive stages of fabrication.
Figure 2B:
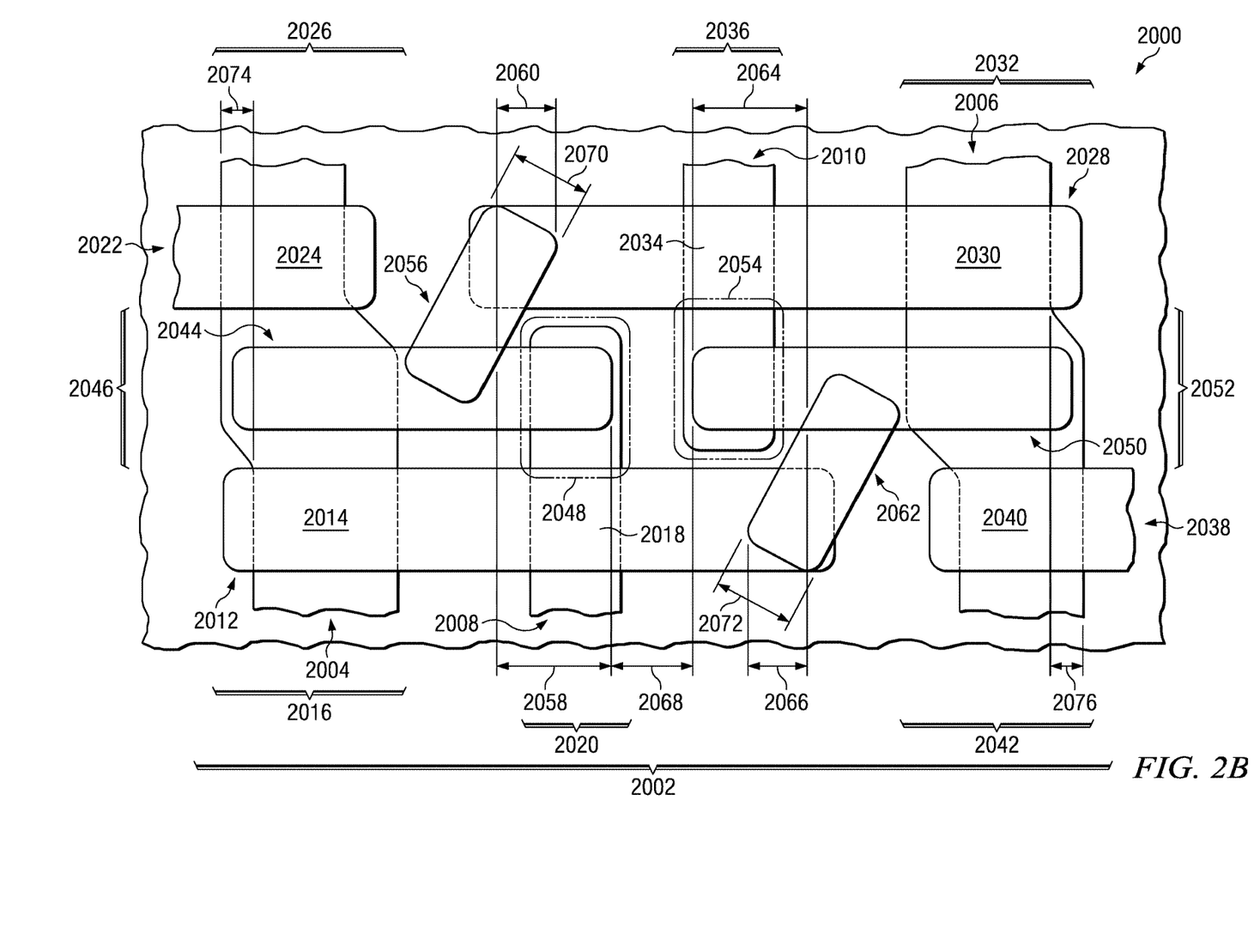
Figure 2C:
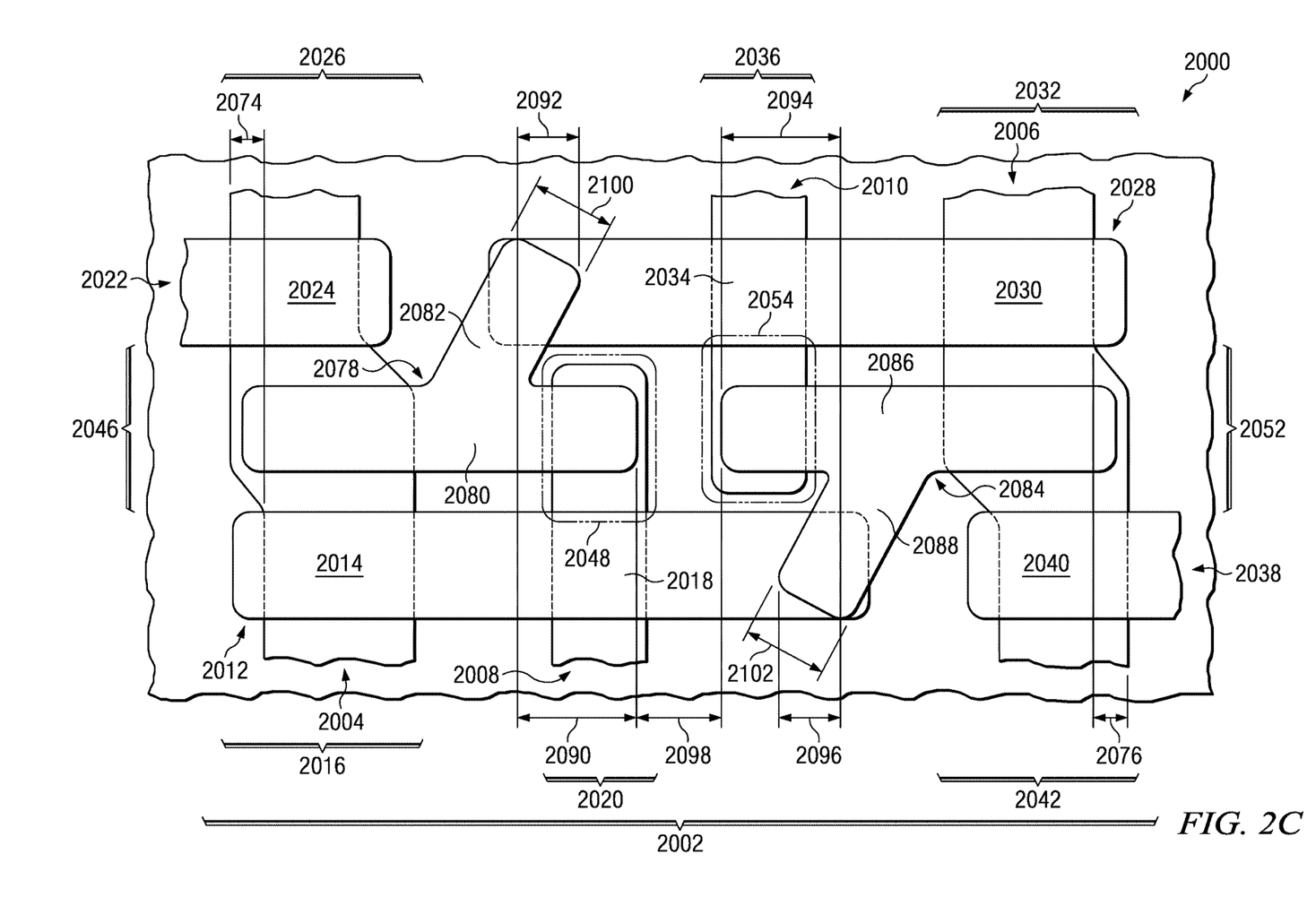

FIG. 2A through FIG. 2C are top views of a pair of cross-coupled inverters in an SRAM cell (2002) contained in an integrated circuit (2000), in which T-shaped contacts are formed according to a second embodiment, depicted in successive stages of fabrication. Referring to FIG. 2A, the SRAM cell (2002) includes a first driver/passgate active strip (2004), a second driver/passgate active strip (2006), a first load active strip (2008) and a second load active strip (2010) with the properties described in reference to FIG. 1A. The SRAM cell (2002) includes a first inverter gate (2012) which crosses the first driver/passgate active strip (2004) and the first load active strip (2008). An area of the first driver/passgate active strip (2004) overlapped by the first inverter gate (2012) forms a channel region (2014) of a first driver transistor (2016) of the SRAM cell (2002). An area of the first load active strip (2008) overlapped by the first inverter gate (2012) forms a channel region (2018) of a first load transistor (2020) of the SRAM cell (2002). The SRAM cell (2002) includes a first passgate gate (2022) which crosses the first driver/passgate active strip (2004). An area of the first driver/passgate active strip (2004) overlapped by the first passgate gate (2022) forms a channel region (2024) of a first passgate transistor (2026) of the SRAM cell (2002). The first driver transistor (2016) and first load transistor (2020) are part of a first inverter of the SRAM cell (2002). Similarly, the SRAM cell (2002) includes a second inverter gate (2028) which crosses the second driver/passgate active strip (2006) and the second load active strip (2010). An area of the second driver/passgate active strip (2006) overlapped by the second inverter gate (2028) forms a channel region (2030) of a second driver transistor (2032) of the SRAM cell (2002). An area of the second load active strip (2010) overlapped by the second inverter gate (2028) forms a channel region (2034) of a second load transistor (2036) of the SRAM cell (2002). The SRAM cell (2002) includes a second passgate gate (2038) which crosses the second driver/passgate active strip (2006). An area of the second driver/passgate active strip (2006) overlapped by the second passgate gate (2038) forms a channel region (2040) of a second passgate transistor (2042) of the SRAM cell (2002). The second driver transistor (2032) and second load transistor (2036) are part of a second inverter of the SRAM cell (2002).

During a manufacturing process, a dielectric layer (not shown) is formed on the top surface of the integrated circuit (2000) of the second embodiment, described supra. Then a layer of photoresist (not shown) is formed over the dielectric layer. A first drain connecting segment patterned area (2044) of a first T-shaped contact of the SRAM cell (2002) is formed by a first photolithographic exposure step so that the first drain connecting segment patterned area (2044) overlaps the first driver/passgate active strip (2004) over a drain node (2046) of the first driver transistor (2016), and also overlaps the first load active strip (2008) over a drain node (2048) of the first load transistor (2020). A second drain connecting segment patterned area (2050) of a second T-shaped contact of the SRAM cell (2002) is also formed by the first photolithographic exposure step so that the second drain connecting segment patterned area (2050) overlaps the second driver/passgate active strip (2006) over a drain node (2052) of the second driver transistor (2032), and also overlaps the second load active strip (2010) over a drain node (2054) of the second load transistor (2036).

In another step of the manufacturing process, shown in FIG. 2B, a first gate connecting segment patterned area (2056) of the first T-shaped contact is formed by a second photolithographic exposure step so that the first gate connecting segment patterned area (2056) overlaps the second inverter gate (2028) and intersects the first drain connecting segment patterned area (2044) so that an end of the first drain connecting segment patterned area (2044) over the drain node (2048) of the first load transistor (2020) extends beyond the first gate connecting segment patterned area (2056) by a first pattern lateral offset distance (2058). In the instant embodiment, an end of the first gate connecting segment patterned area (2056) overlapping the second inverter gate (2028) is inclined toward the end of the first drain connecting segment patterned area (2044) by a first pattern inclined distance (2060) which may be greater than half of the first pattern lateral offset distance (2058).

Similarly, a second gate connecting segment patterned area (2062) of the second T-shaped contact is formed by the same second photolithographic exposure step so that the second gate connecting segment patterned area (2062) overlaps the first inverter gate (2012) and intersects the second drain connecting segment patterned area (2050) so that an end of the second drain connecting segment patterned area (2050) over the drain node (2054) of the second load transistor (2036) extends beyond the second gate connecting segment patterned area (2062) by a second pattern lateral offset distance (2064). In the instant embodiment, an end of the second gate connecting segment patterned area (2062) overlapping the first inverter gate (2012) is inclined toward the end of the second drain connecting segment patterned area (2050) by a second pattern inclined distance (2066) which may be greater than half of the second pattern lateral offset distance (2064).

In one realization of the instant embodiment, the first pattern lateral offset distance (2058) and the second pattern lateral offset distance (2064) may each be greater than 10 percent of an end separation distance (2068) between ends of the first drain connecting segment patterned area (2044) and the second drain connecting segment patterned area (2050). In an alternate realization, the first pattern lateral offset distance (2058) may be greater than one-third of a width (2070) of the first gate connecting segment patterned area (2056), and the second pattern lateral offset distance (2064) may be greater than one-third of a width (2072) of the second gate connecting segment patterned area (2062).

In another realization of the instant embodiment, an outer edge of the channel region (2024) of the first passgate transistor (2026) may extend beyond an outer edge of the channel region (2014) of the first driver transistor (2016) by a first driver/passgate active offset distance (2074) which may be greater than half of the end separation distance (2068). Similarly, an outer edge of the channel region (2040) of the second passgate transistor (2042) may extend beyond an outer edge of the channel region (2030) of the second driver transistor (2032) by a second driver/passgate active offset distance (2076) which may be greater than half of the end separation distance (2068).

Referring to FIG. 2C, the first T-shaped contact (2078) is formed in an area defined by the first drain connecting segment patterned area (2044) and the first gate connecting segment patterned area (2056) depicted in FIG. 2B. The first T-shaped contact (2078) includes a first drain connecting segment (2080) in the area defined by the first drain connecting segment patterned area (2044) of FIG. 2B and a first gate connecting segment (2082) in the area defined by the first gate connecting segment patterned area (2056) of FIG. 2B. The first drain connecting segment (2080) makes electrical contact to the drain node (2046) of the first driver transistor (2016) and to the drain node (2048) of the first load transistor (2020). The first gate connecting segment (2082) also makes electrical contact to the second inverter gate (2028). Thus, the first T-shaped contact (2078) provides an electrical connection between the drain node (2046) of the first driver transistor (2016), the drain node (2048) of the first load transistor (2020), and the second inverter gate (2028).

The second T-shaped contact (2084) is formed in an area defined by the second drain connecting segment patterned area (2050) and the second gate connecting segment patterned area (2062) depicted in FIG. 2B. The second T-shaped contact (2084) is formed concurrently with the first T-shaped contact (2078). The second T-shaped contact (2084) includes a second drain connecting segment (2086) in the area defined by the second drain connecting segment patterned area (2050) of FIG. 2B and a second gate connecting segment (2088) in the area defined by the second gate connecting segment patterned area (2062) of FIG. 2B. The second drain connecting segment (2086) makes electrical contact to the drain node (2052) of the second driver transistor (2032) and to the drain node (2054) of the second load transistor (2036). The second gate connecting segment (2088) also makes electrical contact to the first inverter gate (2012). Thus, the second T-shaped contact (2084) provides an electrical connection between the drain node (2052) of the second driver transistor (2032), the drain node (2054) of the second load transistor (2036), and the first inverter gate (2012).

An end of the first drain connecting segment (2080) over the drain node (2048) of the first load transistor (2020) extends beyond the first gate connecting segment (2082) by a first contact lateral offset distance (2090). In the instant embodiment, an end of the first gate connecting segment (2082) overlapping the second inverter gate (2028) is inclined toward the end of the first drain connecting segment (2080) by a first contact inclined distance (2092) which may be greater than half of the first contact lateral offset distance (2090). An end of the second drain connecting segment (2086) over the drain node (2052) of the second load transistor (2032) extends beyond the second gate connecting segment (2088) by a second contact lateral offset distance (2094). In the instant embodiment, an end of the second gate connecting segment (2088) overlapping the first inverter gate (2012) is inclined toward the end of the second drain connecting segment (2086) by a second contact inclined distance (2096) which may be greater than half of the second contact lateral offset distance (2094).

In one realization of the instant embodiment, the first contact lateral offset distance (2090) and the second contact lateral offset distance (2094) may be each greater than 10 percent of an end separation distance (2098) between ends of the first drain connecting segment (2080) and the second drain connecting segment (2086). In an alternate realization, the first contact lateral offset distance (2090) may be greater than one-third of a width (2100) of the first gate connecting segment (2082), and the second contact lateral offset distance (2094) may be greater than one-third of a width (2102) of the second gate connecting segment (2088).

Figure 3:
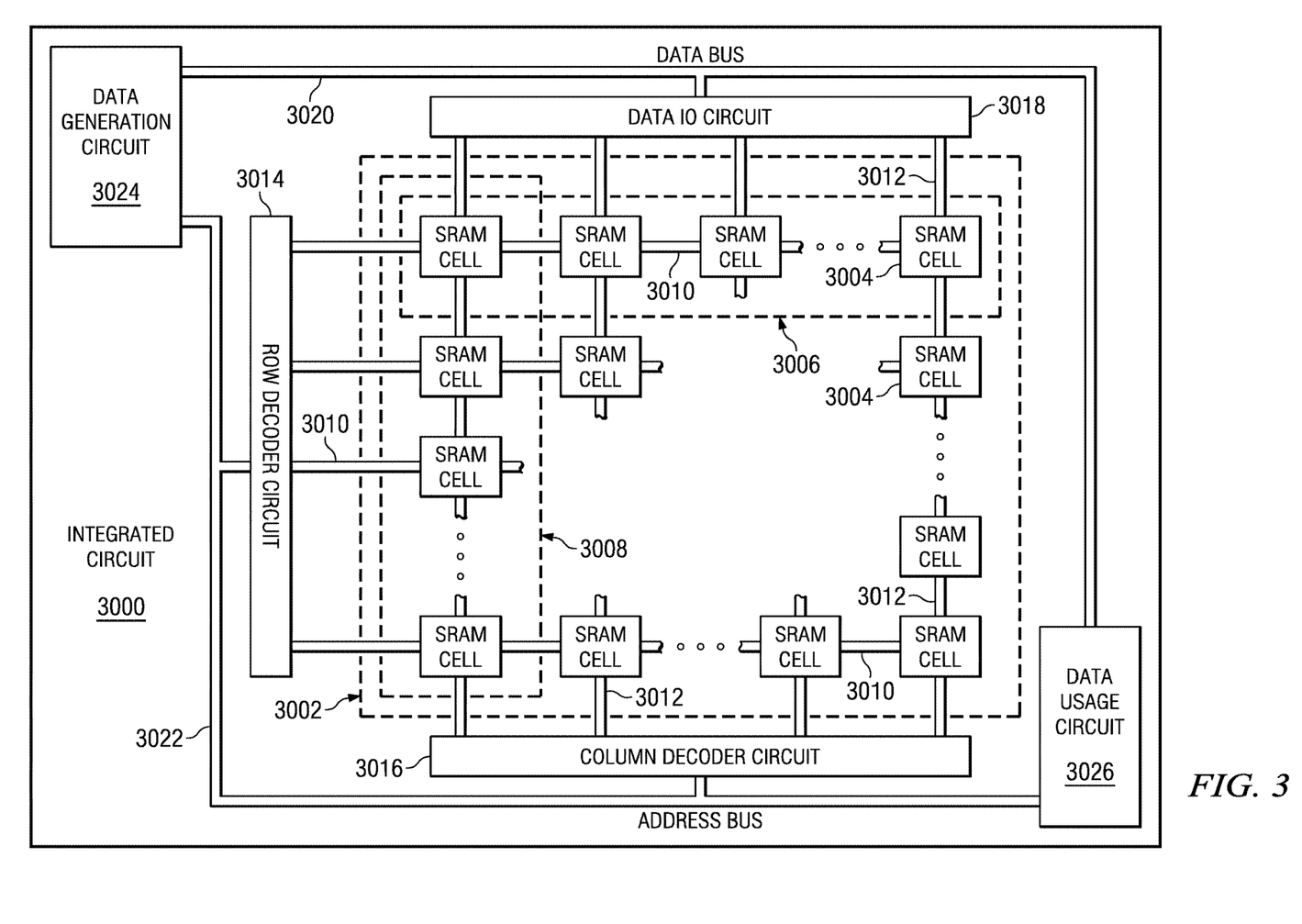
FIG. 3 is an integrated circuit containing an SRAM cell array which includes SRAM cells with T-shaped contacts formed according to one embodiment.

FIG. 3 is an integrated circuit (3000) containing an SRAM cell array (3002) which includes SRAM cells (3004) with T-shaped contacts formed according to one embodiment. The SRAM cells (3004) are arranged in rows (3006) and columns (3008). Each word line bus (3010) is connected to SRAM cells (3004) in a row (3006). Each word line bus (3010) may include more than one word line. Each bit line bus (3012) is connected to SRAM cells (3004) in a column (3008). Each bit line bus (3012) may include one or more bit or bit-bar lines. A row decoder circuit (3014) applies appropriate biases to word lines in the word line buses (3010). A column decoder circuit (3016) applies appropriate biases to bit or bit-bar lines in the bit line buses (3012). A data input/output (10) circuit (3018) reads data from the bit or bit-bar lines in the bit line buses (3012) during read operations and applies appropriate potentials to the bit or bit-bar lines in the bit line buses (3012) during single sided write operations. The integrated circuit further includes a data bus (3020) which carries data bits between the data 10 circuit (3018) and circuits in the integrated circuit (3000), and an address bus (3022) which is used to select SRAM cells (3004) in the SRAM cell array (3002) for read and write operations. The address bus (3022) is connected to the row decoder circuit (3014) and the column decoder circuit (3016). The integrated circuit (3000) may also contain a data generation circuit (3024) which connects to the data bus (3020) and address bus (3022). The data generation circuit (3024) produces incoming data bits for storage in the SRAM cell array (3002). The data bus (3020) carries the incoming data bits from the data generation circuit (3024) to the SRAM cell array (3002). The integrated circuit (3000) may also contain a data usage circuit (3026) which connects to the data bus (3020) and address bus (3022). The data usage circuit (3026) uses outgoing data bits which were stored in the SRAM cell array (3002). The data bus (3020) carries the outgoing data bits from the SRAM cell array (3002) to the data usage circuit (3026).

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit containing an array of SRAM (Static Random Access Memory) cells, comprising the steps:
providing an integrated circuit containing a first driver/passgate active strip having a first conductivity type, a second driver/passgate active strip having said first conductivity type, a first load active strip having a second conductivity type opposite from said first conductivity type, a second load active strip having said second conductivity type, a first inverter gate that crosses said first driver/passgate active strip over a channel region of a first driver transistor and crosses said first load active strip over a channel region of a first load transistor, and a second inverter gate that crosses said second driver/passgate active strip over a channel region of a second driver transistor and crosses said second load active strip over a channel region of a second load transistor;
performing a first photolithographic exposure step to form a first drain connecting segment patterned area of a first T-shaped contact and to form a second drain connecting segment patterned area of a second T-shaped contact, such that said first drain connecting segment patterned area overlaps said first driver/passgate active strip over a drain node of said first driver transistor and also overlaps said first load active strip over a drain node of said first load transistor, and said second drain connecting segment patterned area overlaps said second driver/passgate active strip over a drain node of said second driver transistor and overlaps said second load active strip over a drain node of said second load transistor;
performing a second photolithographic exposure step to form a first gate connecting segment patterned area of said first T-shaped contact and to form a second gate connecting segment patterned area of said second T-shaped contact, such that said first gate connecting segment patterned area intersects said first drain connecting segment patterned area, and said second gate connecting segment patterned area intersects said second drain connecting segment patterned area;
forming said first T-shaped contact in an area defined by said first drain connecting segment patterned area and said first gate connecting segment patterned area, such that said first T-shaped contact includes a first drain connecting segment in an area defined by said first drain connecting segment patterned area, said first T-shaped contact also includes a first gate connecting segment in an area defined by said first gate connecting segment patterned area, said first drain connecting segment is substantially laterally adjacent to said first gate connecting segment; and said first T-shaped contact provides an electrical connection between said drain node of said first driver transistor, said drain node of said first load transistor, and said second inverter gate;
forming said second T-shaped contact concurrently with said first T-shaped contact in an area defined by said second drain connecting segment patterned area and said second gate connecting segment patterned area, such that said second T-shaped contact includes a second drain connecting segment in an area defined by said second drain connecting segment patterned area, said second T-shaped contact also includes a second gate connecting segment in an area defined by said second gate connecting segment patterned area, said second drain connecting segment is substantially laterally adjacent to said second gate connecting segment; and said second T-shaped contact provides an electrical connection between said drain node of said second driver transistor, said drain node of said second load transistor, and said first inverter gate;
forming a first passgate gate over said first driver/passgate active strip, an area of said first driver/passgate active strip overlapped by said first passgate gate forming a channel region of a first passgate transistor; and
forming a second passgate gate over said second driver/passgate active strip, an area of said second driver/passgate active strip overlapped by said second passgate gate forming a channel region of a second passgate transistor;
wherein an outer edge of said channel region of said first passgate transistor extends beyond an outer edge of said channel region of said first driver transistor by a distance greater than half a distance by which an end of said first drain connecting segment over said drain node of said first load transistor extends beyond said first gate connecting segment;
further wherein an outer edge of said channel region of said second passgate transistor extends beyond an outer edge of said channel region of said second driver transistor by a distance greater than half a distance by which an end of said second drain connecting segment over said drain node of said second load transistor extends beyond said second gate connecting segment; and further wherein intersecting edges of said first drain connecting segment and said first gate connecting segment are substantially perpendicular, and intersecting edges of said second drain connecting segment and said second gate connecting segment are substantially perpendicular.

2. The process of claim 1, wherein said end of said first drain connecting segment over said drain node of said first load transistor extends beyond an inner corner of an intersection of said first drain connecting segment with said first gate connecting segment by said distance greater than 10 percent of an end separation distance between said end of said first drain connecting segment and said end of said second drain connecting segment, and said end of said second drain connecting segment over said drain node of said second load transistor extends beyond an inner corner of an intersection of said second drain connecting segment with said second gate connecting segment by said distance greater than 10 percent of said end separation distance between said ends of said first drain connecting segment and said second drain connecting segment.

3. A process of forming an integrated circuit containing an array of SRAM (Static Random Access Memory) cells, comprising the steps:

providing an integrated circuit containing a first driver/passgate active strip having a first conductivity type, a second driver/passgate active strip having said first conductivity type, a first load active strip having a second conductivity type opposite from said first conductivity type, a second load active strip having said second conductivity type, a first inverter gate that crosses said first driver/passgate active strip over a channel region of a first driver transistor and crosses said first load active strip over a channel region of a first load transistor, and a second inverter gate that crosses said second driver/passgate active strip over a channel region of a second driver transistor and crosses said second load active strip over a channel region of a second load transistor;

performing a first photolithographic exposure step to form a first drain connecting segment patterned area of a first T-shaped contact and to form a second drain connecting segment patterned area of a second T-shaped contact, such that said first drain connecting segment patterned area overlaps said first driver/passgate active strip over a drain node of said first driver transistor and also overlaps said first load active strip over a drain node of said first load transistor, and said second drain connecting segment patterned area overlaps said second driver/passgate active strip over a drain node of said second driver transistor and overlaps said second load active strip over a drain node of said second load transistor;

performing a second photolithographic exposure step to form a first gate connecting segment patterned area of said first T-shaped contact and to form a second gate connecting segment patterned area of said second T-shaped contact, such that said first gate connecting segment patterned area intersects said first drain connecting segment patterned area, and said second gate connecting segment patterned area intersects said second drain connecting segment patterned area;

forming said first T-shaped contact in an area defined by said first drain connecting segment patterned area and said first gate connecting segment patterned area, such that said first T-shaped contact includes a first drain connecting segment in an area defined by said first drain connecting segment patterned area, said first T-shaped contact also includes a first gate connecting segment in an area defined by said first gate connecting segment patterned area, said first drain connecting segment is substantially laterally adjacent to said first gate connecting segment; and said first T-shaped contact provides an electrical connection between said drain node of said first driver transistor, said drain node of said first load transistor, and said second inverter gate;

forming said second T-shaped contact concurrently with said first T-shaped contact in an area defined by said second drain connecting segment patterned area and said second gate connecting segment patterned area, such that said second T-shaped contact includes a second drain connecting segment in an area defined by said second drain connecting segment patterned area, said second T-shaped contact also includes a second gate connecting segment in an area defined by said second gate connecting segment patterned area, said second drain connecting segment is substantially laterally adjacent to said second gate connecting segment; and said second T-shaped contact provides an electrical connection between said drain node of said second driver transistor, said drain node of said second load transistor, and said first inverter gate;

forming a first passgate gate over said first driver/passgate active strip, an area of said first driver/passgate active strip overlapped by said first passgate gate forming a channel region of a first passgate transistor; and forming a second passgate gate over said second driver/passgate active strip, an area of said second driver/passgate active strip overlapped by said second passgate gate forming a channel region of a second passgate transistor;

wherein an outer edge of said channel region of said first passgate transistor extends beyond an outer edge of said channel region of said first driver transistor by a distance greater than half a distance by which an end of said first drain connecting segment over said drain node of said first load transistor extends beyond said first gate connecting segment; and further wherein intersecting edges of said first drain connecting segment and said first gate connecting segment are substantially perpendicular, and intersecting edges of said second drain connecting segment and said second gate connecting segment are substantially perpendicular.

4. The process of claim 3, wherein said end of said first drain connecting segment over said drain node of said first load transistor extends beyond an inner corner of an intersection of said first drain connecting segment with said first gate connecting segment by said distance greater than 10 percent of an end separation distance between said end of said first drain connecting segment and an end of said second drain connecting segment, and said end of said second drain connecting segment over said drain node of said second load transistor extends beyond an inner corner of an intersection of said second drain connecting segment with said second gate connecting segment by a distance greater than 10 percent of said end separation distance between said ends of said first drain connecting segment and said second drain connecting segment.

5. The process of claim 3, wherein an outer edge of said channel region of said second passgate transistor extends beyond an outer edge of said channel region of said second driver transistor by a distance greater than half a distance by which an end of said second drain connecting segment over said drain node of said second load transistor extends beyond said second gate connecting segment.

6. A process of forming an integrated circuit containing an array of SRAM (Static Random Access Memory) cells, comprising the steps:
providing an integrated circuit containing a first driver/passgate active strip having a first conductivity type, a second driver/passgate active strip having said first conductivity type, a first load active strip having a second conductivity type opposite from said first conductivity type, a second load active strip having said second conductivity type, a first inverter gate that crosses said first driver/passgate active strip over a channel region of a first driver transistor and crosses said first load active strip over a channel region of a first load transistor, and a second inverter gate that crosses said second driver/passgate active strip over a channel region of a second driver transistor and crosses said second load active strip over a channel region of a second load transistor;
performing a first photolithographic exposure step to form a first drain connecting segment patterned area of a first T-shaped contact and to form a second drain connecting segment patterned area of a second T-shaped contact, such that said first drain connecting segment patterned area overlaps said first driver/passgate active strip over a drain node of said first driver transistor and also overlaps said first load active strip over a drain node of said first load transistor, and said second drain connecting segment patterned area overlaps said second driver/passgate active strip over a drain node of said second driver transistor and overlaps said second load active strip over a drain node of said second load transistor;
performing a second photolithographic exposure step to form a first gate connecting segment patterned area of said first T-shaped contact and to form a second gate connecting segment patterned area of said second T-shaped contact, such that said first gate connecting segment patterned area intersects said first drain connecting segment patterned area, and said second gate connecting segment patterned area intersects said second drain connecting segment patterned area;
forming said first T-shaped contact in an area defined by said first drain connecting segment patterned area and said first gate connecting segment patterned area, such that said first T-shaped contact includes a first drain connecting segment in an area defined by said first drain connecting segment patterned area, said first T-shaped contact also includes a first gate connecting segment in an area defined by said first gate connecting segment patterned area, said first drain connecting segment is substantially laterally adjacent to said first gate connecting segment; and said first T-shaped contact provides an electrical connection between said drain node of said first driver transistor, said drain node of said first load transistor, and said second inverter gate;
forming said second T-shaped contact concurrently with said first T-shaped contact in an area defined by said second drain connecting segment patterned area and said second gate connecting segment patterned area, such that said second T-shaped contact includes a second drain connecting segment in an area defined by said second drain connecting segment patterned area, said second T-shaped contact also includes a second gate connecting segment in an area defined by said second gate connecting segment patterned area, said second drain connecting segment is substantially laterally adjacent to said second gate connecting segment; and said second T-shaped contact provides an electrical connection between said drain node of said second driver transistor, said drain node of said second load transistor, and said first inverter gate;
an end of said first gate connecting segment overlapping said second inverter gate is inclined toward an end of said first drain connecting segment over said drain node of said first load transistor by a first inclined distance, said first inclined distance being greater than half a distance by which said end of said first drain connecting segment extends beyond said first gate connecting segment; and
an end of said second gate connecting segment overlapping said first inverter gate is inclined toward an end of said second drain connecting segment over said drain node of said second load transistor by a second inclined distance, said second inclined distance being greater than half a distance by which said end of said second drain connecting segment extends beyond said second gate connecting segment.

7. The process of claim 6, wherein said end of said first drain connecting segment over said drain node of said first load transistor extends beyond an inner corner of an intersection of said first drain connecting segment with said first gate connecting segment by said distance greater than 10 percent of an end separation distance between said end of said first drain connecting segment and said end of said second drain connecting segment, and said end of said second drain connecting segment over said drain node of said second load transistor extends beyond an inner corner of an intersection of said second drain connecting segment with said second gate connecting segment by said distance greater than 10 percent of said end separation distance between said ends of said first drain connecting segment and said second drain connecting segment.

8. The process of claim 6, further comprising:
forming a first passgate gate over said first driver/passgate active strip, an area of said first driver/passgate active strip overlapped by said first passgate gate forming a channel region of a first passgate transistor; and
forming a second passgate gate over said second driver/passgate active strip, an area of said second driver/passgate active strip overlapped by said second passgate gate forming a channel region of a second passgate transistor;
wherein an outer edge of said channel region of said first passgate transistor extends beyond an outer edge of said channel region of said first driver transistor by a distance greater than half an end separation distance between said end of said first drain connecting segment and said end of said second drain connecting segment; and
further wherein an outer edge of said channel region of said second passgate transistor extends beyond an outer edge of said channel region of said second driver transistor by a distance greater than half said end separation distance.

9. A process of forming an integrated circuit containing an array of SRAM (Static Random Access Memory) cells, comprising the steps:
providing an integrated circuit containing a first driver/passgate active strip having a first conductivity type, a second driver/passgate active strip having said first conductivity type, a first load active strip having a second conductivity type opposite from said first conductivity type, a second load active strip having said second conductivity type, a first inverter gate that crosses said first driver/passgate active strip over a channel region of a first driver transistor and crosses said first load active strip over a channel region of a first load transistor, and a second inverter gate that crosses said second driver/passgate active strip over a channel region of a second driver transistor and crosses said second load active strip over a channel region of a second load transistor;

performing a first photolithographic exposure step to form a first drain connecting segment patterned area of a first T-shaped contact and to form a second drain connecting segment patterned area of a second T-shaped contact, such that said first drain connecting segment patterned area overlaps said first driver/passgate active strip over a drain node of said first driver transistor and also overlaps said first load active strip over a drain node of said first load transistor, and said second drain connecting segment patterned area overlaps said second driver/passgate active strip over a drain node of said second driver transistor and overlaps said second load active strip over a drain node of said second load transistor;

performing a second photolithographic exposure step to form a first gate connecting segment patterned area of said first T-shaped contact and to form a second gate connecting segment patterned area of said second T-shaped contact, such that said first gate connecting segment patterned area intersects said first drain connecting segment patterned area, and said second gate connecting segment patterned area intersects said second drain connecting segment patterned area;

forming said first T-shaped contact in an area defined by said first drain connecting segment patterned area and said first gate connecting segment patterned area, such that said first T-shaped contact includes a first drain connecting segment in an area defined by said first drain connecting segment patterned area, said first T-shaped contact also includes a first gate connecting segment in an area defined by said first gate connecting segment patterned area, said first drain connecting segment is substantially laterally adjacent to said first gate connecting segment; and said first T-shaped contact provides an electrical connection between said drain node of said first driver transistor, said drain node of said first load transistor, and said second inverter gate;

forming said second T-shaped contact concurrently with said first T-shaped contact in an area defined by said second drain connecting segment patterned area and said second gate connecting segment patterned area, such that said second T-shaped contact includes a second drain connecting segment in an area defined by said second drain connecting segment patterned area, said second T-shaped contact also includes a second gate connecting segment in an area defined by said second gate connecting segment patterned area, said second drain connecting segment is substantially laterally adjacent to said second gate connecting segment; and said second T-shaped contact provides an electrical connection between said drain node of said second driver transistor, said drain node of said second load transistor, and said first inverter gate; and an end of said first gate connecting segment overlapping said second inverter gate is inclined toward an end of said first drain connecting segment over said drain node of said first load transistor by a first inclined distance, said first inclined distance being greater than half a distance by which said end of said first drain connecting segment extends beyond said first gate connecting segment.

10. The process of claim 9, wherein said end of said first drain connecting segment over said drain node of said first load transistor extends beyond an inner corner of an intersection of said first drain connecting segment with said first gate connecting segment by said distance greater than 10 percent of an end separation distance between said end of said first drain connecting segment and an end of said second drain connecting segment, and said end of said second drain connecting segment over said drain node of said second load transistor extends beyond an inner corner of an intersection of said second drain connecting segment with said second gate connecting segment by a distance greater than 10 percent of said end separation distance between said ends of said first drain connecting segment and said second drain connecting segment.

11. The process of claim 9, further comprising:
forming a first passgate gate over said first driver/passgate active strip, an area of said first driver/passgate active strip overlapped by said first passgate gate forming a channel region of a first passgate transistor; and
forming a second passgate gate over said second driver/passgate active strip, an area of said second driver/passgate active strip overlapped by said second passgate gate forming a channel region of a second passgate transistor;
wherein an outer edge of said channel region of said first passgate transistor extends beyond an outer edge of said channel region of said first driver transistor by a distance greater than half an end separation distance between said end of said first drain connecting segment and an end of said second drain connecting segment; and
further wherein an outer edge of said channel region of said second passgate transistor extends beyond an outer edge of said channel region of said second driver transistor by a distance greater than half said end separation distance.

12. The process of claim 9, wherein an end of said second gate connecting segment overlapping said first inverter gate is inclined toward an end of said second drain connecting segment by a second inclined distance, said second inclined distance being greater than half a distance by which said end of said second drain connecting segment over said drain node of said second load transistor extends beyond said second gate connecting segment.

13. A process of forming an integrated circuit containing an array of memory cells, comprising the steps:
providing an integrated circuit containing a first driver/passgate active strip having a first conductivity type, a second driver/passgate active strip having said first conductivity type, a first load active strip having a second conductivity type opposite from said first conductivity type, a second load active strip having said second conductivity type, a first inverter gate that crosses said first driver/passgate active strip over a channel region of a first driver transistor and crosses said first load active strip over a channel region of a first load transistor, and a second inverter gate that crosses said second driver/passgate active strip over a channel region of a second driver transistor and crosses said second load active strip over a channel region of a second load transistor;

performing a first photolithographic exposure step to form a first drain connecting segment patterned area of a first T-shaped contact and to form a second drain connecting segment patterned area of a second T-shaped contact, such that said first drain connecting segment patterned area overlaps said first driver/passgate active strip over a drain node of said first driver transistor and also overlaps said first load active strip over a drain node of said first load transistor, and said second drain connecting segment patterned area overlaps said second driver/passgate active strip over a drain node of said second driver transistor and overlaps said second load active strip over a drain node of said second load transistor;

performing a second photolithographic exposure step to form a first gate connecting segment patterned area of said first T-shaped contact and to form a second gate connecting segment patterned area of said second T-shaped contact, such that said first gate connecting segment patterned area intersects said first drain connecting segment patterned area, and said second gate connecting segment patterned area intersects said second drain connecting segment patterned area;

forming said first T-shaped contact in an area defined by said first drain connecting segment patterned area and said first gate connecting segment patterned area, such that said first T-shaped contact includes a first drain connecting segment in an area defined by said first drain connecting segment patterned area, said first T-shaped contact also includes a first gate connecting segment in an area defined by said first gate connecting segment patterned area, said first drain connecting segment is substantially laterally adjacent to said first gate connecting segment; and said first T-shaped contact provides an electrical connection between said drain node of said first driver transistor, said drain node of said first load transistor, and said second inverter gate;

forming said second T-shaped contact concurrently with said first T-shaped contact in an area defined by said second drain connecting segment patterned area and said second gate connecting segment patterned area, such that said second T-shaped contact includes a second drain connecting segment in an area defined by said second drain connecting segment patterned area, said second T-shaped contact also includes a second gate connecting segment in an area defined by said second gate connecting segment patterned area, said second drain connecting segment is substantially laterally adjacent to said second gate connecting segment; and said second T-shaped contact provides an electrical connection between said drain node of said second driver transistor, said drain node of said second load transistor, and said first inverter gate;

forming a first passgate gate over said first driver/passgate active strip, an area of said first driver/passgate active strip overlapped by said first passgate gate forming a channel region of a first passgate transistor; and forming a second passgate gate over said second driver/passgate active strip, an area of said second driver/passgate active strip overlapped by said second passgate gate forming a channel region of a second passgate transistor;

wherein an outer edge of said channel region of said first passgate transistor extends beyond an outer edge of said channel region of said first driver transistor by a distance greater than half a distance by which an end of said first drain connecting segment over said drain node of said first load transistor extends beyond said first gate connecting segment;

further wherein an outer edge of said channel region of said second passgate transistor extends beyond an outer edge of said channel region of said second driver transistor by a distance greater than half a distance by which an end of said second drain connecting segment over said drain node of said second load transistor extends beyond said second gate connecting segment; and further wherein intersecting edges of said first drain connecting segment and said first gate connecting segment are substantially perpendicular, and intersecting edges of said second drain connecting segment and said second gate connecting segment are substantially perpendicular.

14. The process of claim 13, wherein said end of said first drain connecting segment over said drain node of said first load transistor extends beyond an inner corner of said intersection of said first drain connecting segment with said first gate connecting segment by said distance greater than one-third of a width of said first gate connecting segment; and said end of said second drain connecting segment over said drain node of said second load transistor extends beyond an inner corner of said intersection of said second drain connecting segment with said second gate connecting segment by said distance greater than one-third of a width of said second gate connecting segment.

15. A process of forming an integrated circuit containing an array of memory cells, comprising the steps:

providing an integrated circuit containing a first driver/passgate active strip having a first conductivity type, a second driver/passgate active strip having said first conductivity type, a first load active strip having a second conductivity type opposite from said first conductivity type, a second load active strip having said second conductivity type, a first inverter gate that crosses said first driver/passgate active strip over a channel region of a first driver transistor and crosses said first load active strip over a channel region of a first load transistor, and a second inverter gate that crosses said second driver/passgate active strip over a channel region of a second driver transistor and crosses said second load active strip over a channel region of a second load transistor;

performing a first photolithographic exposure step to form a first drain connecting segment patterned area of a first T-shaped contact and to form a second drain connecting segment patterned area of a second T-shaped contact, such that said first drain connecting segment patterned area overlaps said first driver/passgate active strip over a drain node of said first driver transistor and also overlaps said first load active strip over a drain node of said first load transistor, and said second drain connecting segment patterned area overlaps said second driver/passgate active strip over a drain node of said second driver transistor and overlaps said second load active strip over a drain node of said second load transistor;

performing a second photolithographic exposure step to form a first gate connecting segment patterned area of said first T-shaped contact and to form a second gate connecting segment patterned area of said second T-shaped contact, such that said first gate connecting segment patterned area intersects said first drain connecting segment patterned area, and said second gate connecting segment patterned area intersects said second drain connecting segment patterned area;

forming said first T-shaped contact in an area defined by said first drain connecting segment patterned area and said first gate connecting segment patterned area, such that said first T-shaped contact includes a first drain connecting segment in an area defined by said first drain connecting segment patterned area, said first T-shaped contact also includes a first gate connecting segment in an area defined by said first gate connecting segment patterned area, said first drain connecting segment is substantially laterally adjacent to said first gate connecting segment; and said first T-shaped contact provides an electrical connection between said drain node of said first driver transistor, said drain node of said first load transistor, and said second inverter gate;

forming said second T-shaped contact concurrently with said first T-shaped contact in an area defined by said second drain connecting segment patterned area and said second gate connecting segment patterned area, such that said second T-shaped contact includes a second drain connecting segment in an area defined by said second drain connecting segment patterned area, said second T-shaped contact also includes a second gate connecting segment in an area defined by said second gate connecting segment patterned area, said second drain connecting segment is substantially laterally adjacent to said second gate connecting segment; and said second T-shaped contact provides an electrical connection between said drain node of said second driver transistor, said drain node of said second load transistor, and said first inverter gate;

forming a first passgate gate over said first driver/passgate active strip, an area of said first driver/passgate active strip overlapped by said first passgate gate forming a channel region of a first passgate transistor; and forming a second passgate gate over said second driver/passgate active strip, an area of said second driver/passgate active strip overlapped by said second passgate gate forming a channel region of a second passgate transistor;

wherein an outer edge of said channel region of said first passgate transistor extends beyond an outer edge of said channel region of said first driver transistor by a distance greater than half a distance by which an end of said first drain connecting segment over said drain node of said first load transistor extends beyond said first gate connecting segment; and further wherein intersecting edges of said first drain connecting segment and said first gate connecting segment are substantially perpendicular, and intersecting edges of said second drain connecting segment and said second gate connecting segment are substantially perpendicular.

16. The process of claim 15, wherein said end of said first drain connecting segment over said drain node of said first load transistor extends beyond an inner corner of said intersection of said first drain connecting segment with said first gate connecting segment by said distance greater than one-third of a width of said first gate connecting segment; and an end of said second drain connecting segment over said drain node of said second load transistor extends beyond an inner corner of said intersection of said second drain connecting segment with said second gate connecting segment by a distance greater than one-third of a width of said second gate connecting segment.

17. The process of claim 15, wherein an outer edge of said channel region of said second passgate transistor extends beyond an outer edge of said channel region of said second driver transistor by a distance greater than half a distance by which an end of said second drain connecting segment over said drain node of said second load transistor extends beyond said second gate connecting segment.

18. A process of forming an integrated circuit containing an array of memory cells, comprising the steps:

providing an integrated circuit containing a first driver/passgate active strip having a first conductivity type, a second driver/passgate active strip having said first conductivity type, a first load active strip having a second conductivity type opposite from said first conductivity type, a second load active strip having said second conductivity type, a first inverter gate that crosses said first driver/passgate active strip over a channel region of a first driver transistor and crosses said first load active strip over a channel region of a first load transistor, and a second inverter gate that crosses said second driver/passgate active strip over a channel region of a second driver transistor and crosses said second load active strip over a channel region of a second load transistor;

performing a first photolithographic exposure step to form a first drain connecting segment patterned area of a first T-shaped contact and to form a second drain connecting segment patterned area of a second T-shaped contact, such that said first drain connecting segment patterned area overlaps said first driver/passgate active strip over a drain node of said first driver transistor and also overlaps said first load active strip over a drain node of said first load transistor, and said second drain connecting segment patterned area overlaps said second driver/passgate active strip over a drain node of said second driver transistor and overlaps said second load active strip over a drain node of said second load transistor;

performing a second photolithographic exposure step to form a first gate connecting segment patterned area of said first T-shaped contact and to form a second gate connecting segment patterned area of said second T-shaped contact, such that said first gate connecting segment patterned area intersects said first drain connecting segment patterned area, and said second gate connecting segment patterned area intersects said second drain connecting segment patterned area;

forming said first T-shaped contact in an area defined by said first drain connecting segment patterned area and said first gate connecting segment patterned area, such that said first T-shaped contact includes a first drain connecting segment in an area defined by said first drain connecting segment patterned area, said first T-shaped contact also includes a first gate connecting segment in an area defined by said first gate connecting segment patterned area, said first drain connecting segment is substantially laterally adjacent to said first gate connecting segment; and said first T-shaped contact provides an electrical connection between said drain node of said first driver transistor, said drain node of said first load transistor, and said second inverter gate;

forming said second T-shaped contact concurrently with said first T-shaped contact in an area defined by said second drain connecting segment patterned area and said second gate connecting segment patterned area, such that said second T-shaped contact includes a second drain connecting segment in an area defined by said second drain connecting segment patterned area, said second T-shaped contact also includes a second gate connecting segment in an area defined by said second gate connecting segment patterned area, said second drain connecting segment is substantially laterally adjacent to said second gate connecting segment; and said second T-shaped contact provides an electrical connection between said drain node of said second driver transistor, said drain node of said second load transistor, and said first inverter gate;

an end of said first gate connecting segment overlapping said second inverter gate is inclined toward an end of said first drain connecting segment over said drain node of said first load transistor by a first inclined distance, said first inclined distance being greater than half a distance by which said end of said first drain connecting segment extends beyond said first gate connecting segment; and an end of said second gate connecting segment overlapping said first inverter gate is inclined toward an end of said second drain connecting segment over said drain node of said second load transistor by a second inclined distance, said second inclined distance being greater than half a distance by which said end of said second drain connecting segment extends beyond said second gate connecting segment.

19. The process of claim 18, further including the steps:

forming a first passgate gate over said first driver/passgate active strip, an area of said first driver/passgate active strip overlapped by said first passgate gate forming a channel region of a first passgate transistor; and forming a second passgate gate over said second driver/passgate active strip, an area of said second driver/passgate active strip overlapped by said second passgate gate forming a channel region of a second passgate transistor;

wherein an outer edge of said channel region of said first passgate transistor extends beyond an outer edge of said channel region of said first driver transistor by a distance greater than half an end separation distance between said ends of said first drain connecting segment and second drain connecting segment; and further wherein an outer edge of said channel region of said second passgate transistor extends beyond an outer edge of said channel region of said second driver transistor by a distance greater than half said end separation distance.

20. The process of claim 18, wherein said end of said first drain connecting segment over said drain node of said first load transistor extends beyond an inner corner of said intersection of said first drain connecting segment with said first gate connecting segment by said distance greater than one-third of a width of said first gate connecting segment; and said end of said second drain connecting segment over said drain node of said second load transistor extends beyond an inner corner of said intersection of said second drain connecting segment with said second gate connecting segment by said distance greater than one-third of a width of said second gate connecting segment.

21. A process of forming an integrated circuit containing an array of memory cells, comprising the steps:

providing an integrated circuit containing a first driver/passgate active strip having a first conductivity type, a second driver/passgate active strip having said first conductivity type, a first load active strip having a second conductivity type opposite from said first conductivity type, a second load active strip having said second conductivity type, a first inverter gate that crosses said first driver/passgate active strip over a channel region of a first driver transistor and crosses said first load active strip over a channel region of a first load transistor, and a second inverter gate that crosses said second driver/passgate active strip over a channel region of a second driver transistor and crosses said second load active strip over a channel region of a second load transistor;

performing a first photolithographic exposure step to form a first drain connecting segment patterned area of a first T-shaped contact and to form a second drain connecting segment patterned area of a second T-shaped contact, such that said first drain connecting segment patterned area overlaps said first driver/passgate active strip over a drain node of said first driver transistor and also overlaps said first load active strip over a drain node of said first load transistor, and said second drain connecting segment patterned area overlaps said second driver/passgate active strip over a drain node of said second driver transistor and overlaps said second load active strip over a drain node of said second load transistor;

performing a second photolithographic exposure step to form a first gate connecting segment patterned area of said first T-shaped contact and to form a second gate connecting segment patterned area of said second T-shaped contact, such that said first gate connecting segment patterned area intersects said first drain connecting segment patterned area, and said second gate connecting segment patterned area intersects said second drain connecting segment patterned area;

forming said first T-shaped contact in an area defined by said first drain connecting segment patterned area and said first gate connecting segment patterned area, such that said first T-shaped contact includes a first drain connecting segment in an area defined by said first drain connecting segment patterned area, said first T-shaped contact also includes a first gate connecting segment in an area defined by said first gate connecting segment patterned area, said first drain connecting segment is substantially laterally adjacent to said first gate connecting segment; and said first T-shaped contact provides an electrical connection between said drain node of said first driver transistor, said drain node of said first load transistor, and said second inverter gate;

forming said second T-shaped contact concurrently with said first T-shaped contact in an area defined by said second drain connecting segment patterned area and said second gate connecting segment patterned area, such that said second T-shaped contact includes a second drain connecting segment in an area defined by said second drain connecting segment patterned area, said second T-shaped contact also includes a second gate connecting segment in an area defined by said second gate connecting segment patterned area, said second drain connecting segment is substantially laterally adjacent to said second gate connecting segment; and said second T-shaped contact provides an electrical connection between said drain node of said second driver transistor, said drain node of said second load transistor, and said first inverter gate; and an end of said first gate connecting segment overlapping said second inverter gate is inclined toward an end of said first drain connecting segment over said drain node of said first load transistor by a first inclined distance, said first inclined distance being greater than half a distance by which said end of said first drain connecting segment extends beyond said first gate connecting segment.

22. The process of claim 21, further including the steps:

forming a first passgate gate over said first driver/passgate active strip, an area of said first driver/passgate active strip overlapped by said first passgate gate forming a channel region of a first passgate transistor; and forming a second passgate gate over said second driver/passgate active strip, an area of said second driver/passgate active strip overlapped by said second passgate gate forming a channel region of a second passgate transistor;

wherein an outer edge of said channel region of said first passgate transistor extends beyond an outer edge of said channel region of said first driver transistor by a distance greater than half an end separation distance between said end of said first drain connecting segment and an end of said second drain connecting segment; and further wherein an outer edge of said channel region of said second passgate transistor extends beyond an outer edge of said channel region of said second driver transistor by a distance greater than half said end separation distance.

23. The process of claim 21, further wherein said end of said first drain connecting segment over said drain node of said first load transistor extends beyond an inner corner of said intersection of said first drain connecting segment with said first gate connecting segment by said distance greater than one-third of a width of said first gate connecting segment; and an end of said second drain connecting segment over said drain node of said second load transistor extends beyond an inner corner of said intersection of said second drain connecting segment with said second gate connecting segment by a distance greater than one-third of a width of said second gate connecting segment.

24. The process of claim 21, wherein an end of said second gate connecting segment overlapping said first inverter gate is inclined toward an end of said second drain connecting segment over said drain node of said second load transistor by a second inclined distance, said second inclined distance being greater than half a distance by which said end of said second drain connecting segment extends beyond said second gate connecting segment.

* * * * *